United States Patent [19]

Kudo et al.

[11] Patent Number: 4,664,767
[45] Date of Patent: May 12, 1987

[54] PLASMA TREATING METHOD AND APPARATUS THEREFOR

[75] Inventors: Katsuyoshi Kudo; Katsuaki Nagatomo; Hideji Yamamoto; Katsuyasu Nishita; Yoshifumi Ogawa, all of Kudamatsu, Japan

[73] Assignee: Hitachi, Ltd., Tokyo, Japan

[21] Appl. No.: 741,526

[22] Filed: Jun. 5, 1985

[30] Foreign Application Priority Data

Jun. 6, 1984 [JP] Japan ................... 59-114534
Nov. 21, 1984 [JP] Japan ................... 59-244426

[51] Int. Cl.⁴ ..................... B01J 19/08; B05D 3/14
[52] U.S. Cl. ..................... 204/164; 204/165; 204/168; 204/192.13; 422/186.05; 422/186.06; 427/39; 156/643
[58] Field of Search ........... 204/164, 165, 168, 192 R, 204/192 E; 422/186.05, 186.06; 156/643; 427/39

[56] References Cited

U.S. PATENT DOCUMENTS

| | | | |
|---|---|---|---|
| 4,207,137 | 6/1980 | Tretola | 422/186.05 |
| 4,232,239 | 11/1980 | Dworsky et al. | 204/164 |
| 4,242,188 | 12/1980 | Niinomi et al. | 204/164 |
| 4,292,153 | 9/1981 | Kudo et al. | 204/164 |
| 4,572,765 | 2/1986 | Berry | 156/643 |

Primary Examiner—Howard S. Williams
Attorney, Agent, or Firm—Antonelli, Terry & Wands

[57] ABSTRACT

Herein disclosed are a plasma treating method and an apparatus therefor. The plasma treating method comprises: the step of monitoring the energies of plasmas corresponding to the faces of a plurality of samples to be treated; the step of adjusting to equalize the energies of said plasmas on the basis of the monitored values; and the step simultaneously treating said samples with the plasmas having said equalized energies. The plasma treating apparatus comprises: a plurality of sample electrodes disposed independently of one another in positions opposed to an opposed electrode in a treating chamber evacuated to be supplied with a treating gas; power supply means for applying and adjusting electric power to said sample electrodes; and monitor means for monitoring the energies of plasmas to be generated between said opposed electrode and said sample electrodes. The electric power to be applied independently of one another from a power supply to the independently formed plural sample electrodes are adjusted such that the energies of the plasmas to be generated between the opposed electrode and the sample electrodes are equalized, whereby the energy of the plasma corresponding to the respective treated faces of the plural samples are equalized so that the uniformity of the treatment of the respective faces of the plural samples to be simultaneously treated can be improved.

14 Claims, 6 Drawing Figures

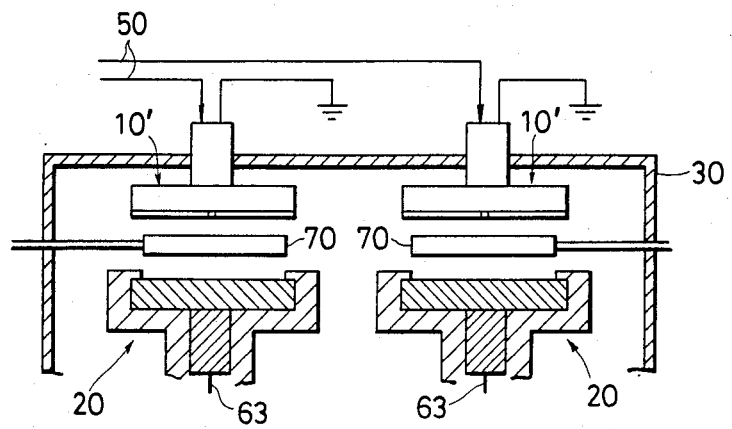
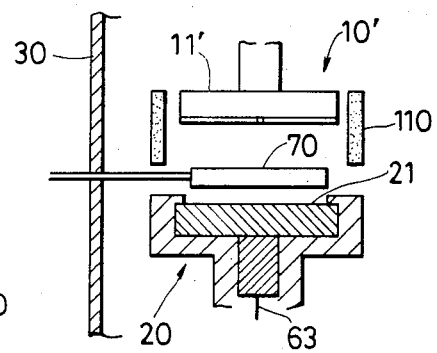
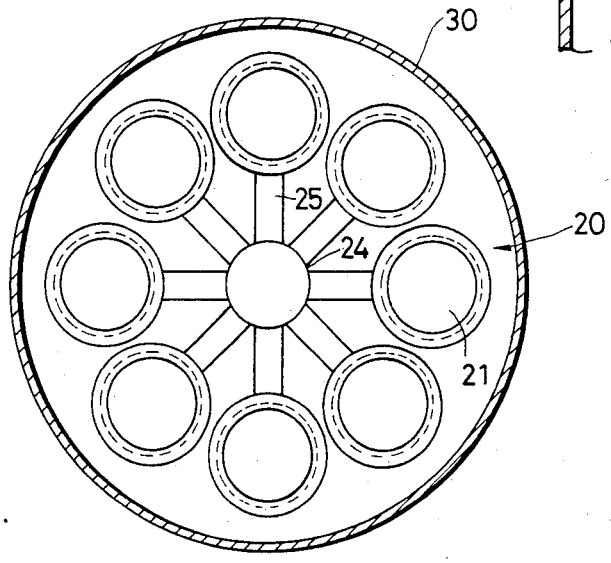

PLASMA TREATING METHOD AND APPARATUS THEREFOR

BACKGROUND OF THE INVENTION

1. Field of the Invention

The present invention relates to a plasma treating method and an apparatus therefor and, more particularly to a plasma treating method suitable for simultaneously treating a plurality of samples under a vacuum by means of plasma and an apparatus therefor.

2. Description of the Prior Art

The so-called "batch type plasma treating apparatus", i.e., a plasma treating apparatus for ionizing a treating gas under a vacuum into plasma to simultaneously treat a plurality of samples by means of the plasma is disclosed in Japanese Patent Laid-Open No. 58-14939, for example. According to this disclosure, an opposed electrode and a sample electrode, on which the plural samples are placed in different positions, are mounted through a discharge space in a treating chamber so that those samples are simultaneously treated by means of the plasma which is generated under the vacuum between the opposed electrode and the sample electrode.

In the plasma treating apparatus disclosed above, those faces (hereafter referred to as "electrode faces") of the sample electrode, which are to be mounted with the samples, have an area 2.5 to 3 times as wide as the total area of the faces of the plural samples to be treated so that the ratio (hereafter referred to as an "area ratio") of the total area of the treated faces of the samples to the area of the electrode faces of the sample electrode takes a small value. During ionization of the treating gas, on the other hand, all the electrode faces of the sample electrode are used for discharge. From the discussions thus far made, electric power has to be supplied excessively according to the small area ratio to the sample electrode so as to generate plasma energy adequate for simultaneously treating the plural samples. As a result, there arises a problem that the capacity of power supply is undesirably large.

As is disclosed in Japanese Patent Laid-Open No. 59-64779, for example, on the other hand, there are placed an internal chamber which is equipped with upper electrode plates having gas exhaust ports such that it covers through a clearance at its lower end each of plural wafers placed on lower electrode plates held on respective holding discs, and those upper and lower electrode plates are connected with a high-frequency power supply so that the wafers are respectively etched.

In the plasma treating apparatus disclosed above, the area of the electrode faces of the lower electrode plates is small, if the discs which hold the lower electrode plates are made of an electrical insulating material, so that the area ratio is accordingly large. This possibly allows that apparatus to solve the problem that the power supply capacity is excessively augmented. However, this power plasma treating apparatus does not have a recognition that uniformity of treatments among the respective treated faces of the plural samples to be simultaneously treated is to be improved by equalizing the plasma energies to be applied to the respective treated faces of the samples, but merely monitors the ending point of the treatment of each sample.

SUMMARY OF THE INVENTION

It is, therefore, an object of the present invention to provide a plasma treating method which is enabled, by adjusting the electric powers to be applied independently of one another to independently formed sample electrodes in a manner to equalize the plasma energies to be generated between an opposed electrode and sample electrodes, to equalize the plasma energies corresponding to the respective treated faces of plural samples thereby to improve the uniformity of the treatment among the respective treated faces of the samples treated simultaneously.

According to a feature of the present invention, there is provided a plasma treating method comprising: the step of monitoring the energies of plasmas corresponding to the faces of a plurality of samples to be treated; the step of adjusting to equalize the energies of said plasmas on the basis of the monitored values; and the step of simultaneously treating said samples with the plasmas having said equalized energies. According to another feature of the present invention, there is provided a plasma treating apparatus comprising: a plurality of sample electrodes disposed in a common plane independently of one another in positions opposed to an opposed electrode in a treating chamber evacuated to be supplied with a treating gas; power supply means for applying and adjusting electric power to said sample electrodes, respectively; and monitor means for monitoring the energies of plasma to be generated between said opposed electrode and said sample electrodes. By adjusting the electric power to be applied independently of one another from a power supply to the independently formed plural sample electrodes such that the energies of the plasmas to be generated between the opposed electrode and the sample electrodes are equalized, the energies of the plasmas corresponding to the respective treated faces of the plural samples are equalized to improve the uniformity of the treatment among the respective faces of the plural samples to be simultaneously treated.

BRIEF DESCRIPTION OF THE DRAWINGS

FIG. 4 is a section taken along arrows B—B of FIG. 3;

FIG. 5 is a longitudinal section showing an essential portion of a third embodiment of the plasma treating apparatus according to the present invention; and FIG. 6 is a longitudinal section showing an essential portion of a fourth embodiment of the plasma treating apparatus according to the present invention.

DESCRIPTION OF THE PREFERRED EMBODIMENTS

The present invention will be described in the following in connection with one embodiment thereof with reference to FIGS. 1 and 2.

Figure 1:
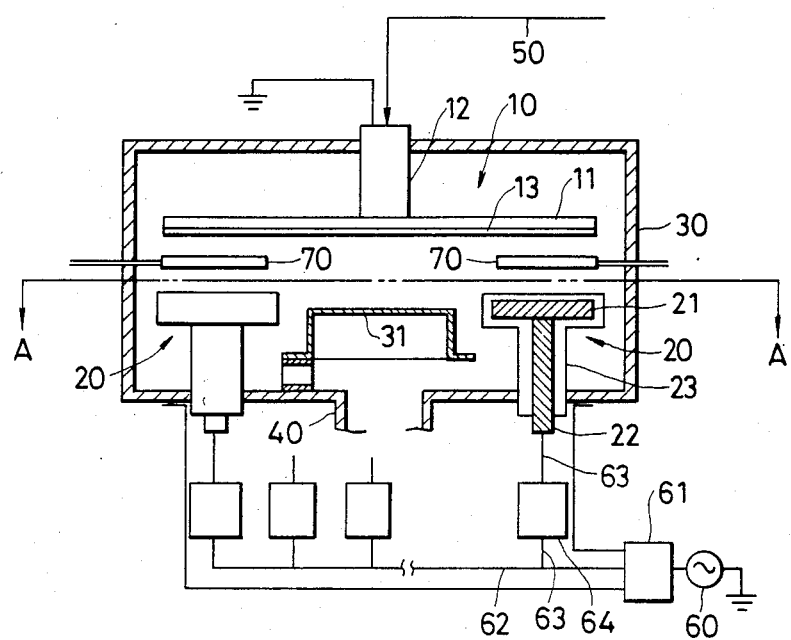
FIG. 1 is a longitudinal section showing one embodiment of the plasma treating apparatus according to the present invention.
Figure 2:
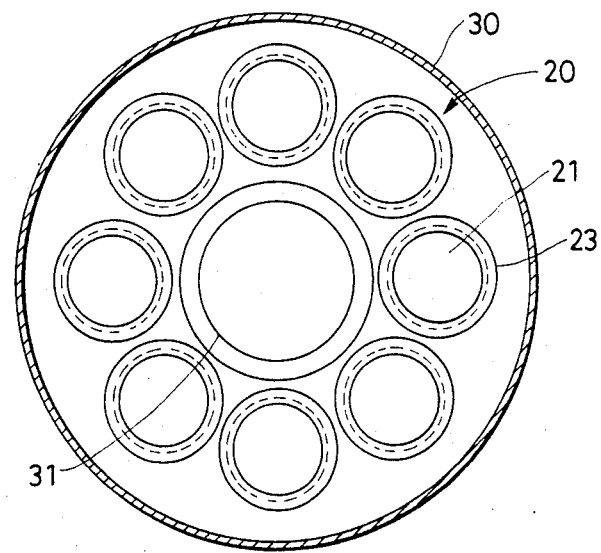
FIG. 2 is a section taken along arrows A—A of FIG. 1.

As shown in FIG. 1, an opposed electrode 10 is composed of an electrode plate 11 and an electrode stem 12, for example. Sample electrodes 20 are formed independently of one another and are composed, in this embodiment, of electrode plates 21, which have the minimum areas necessary for placing samples, and electrode stems 22. In this embodiment, moreover, a treating chamber 30 is piped at the center of its bottom wall with an exhaust pipe 40, which has communication with the inside thereof, and is equipped therein with a baffle 31 facing the exhaust pipe 40. This exhaust pipe 40 is equipped at its midpoint with a variable-conductance valve (not shown), which is connected to an evacuating apparatus (not shown). In this embodiment, still moreover, there is anchored in the top wall of the treating chamber 30 the electrode stem 12 which has its one or upper end portion protruding to the outside of the processing chamber 30. The other or lower end of the electrode stem 12, which is located in the treating chamber 30, is equipped with the electrode plate 11 which is positioned generally horizontally and in alignment with the axis of the electrode stem 12. The electrode plate 11 is formed therein with a gas dispersion chamber (although not shown) and with a number of gas discharge holes (although not shown), which are opened toward the bottom wall of the treating chamber 30 and in communication with the gas disperson chamber. The electrode stem 12 is formed therein with a gas supply passage (although not shown), which extends axially thereof while communicating with the gas dispersion chamber of the electrode plate 11. That face of the electrode plate 11, which faces the bottom wall of the treating chamber 30, is covered except the gas discharge holes with a cover 13. To the one end portion of the electrode stem 12, there is connected one end of a gas supply pipe 50 which in turn communicates with a gas supply passage. The other end of the gas supply pipe 50 is connected through a gas flow controller (although not shown) with a gas source (although not shown). The electrode stem 12 is grounded to the earth. In this embodiment, further moreover, there are anchored in the bottom wall of the treating chamber 30 the electrode stems 22 which have their respective one or lower end portions protruding to the outside of the treating chamber 30. The other or upper ends of the electrode stems 22, which are located in the treating chamber 30, are equipped with the electrode plates 21 which are positioned generally horizontally and in alignment with the axes of the electrode stems 22 such that their upper faces provide the sample placing faces. As a result, as shown in FIG. 2, the eight sample electrodes 20 in this embodiment are arranged around the baffle 31 and on a circle generally concentric to the treating chamber 30. The portions of the electrode plates 21 except the sample placing faces and the portions of the electrode stems 22 except the lower ends are respectively covered with insulators 23 so that the sample electrodes 20 and the treating chamber 30 are electrically insulated from each other. In this embodiment, the sample electrodes 20 including the insulators 23 are prevented from contacting one another. The sample electrodes 20 are connected independently of one another with the power supply such as a high-frequency power supply 60 through a synthetic impedance regulator unit 61 and individual impedance regulator units 64. With the respective lower ends of the electrode stems 22, more specifically, there are connected high-frequency branch circuits 63 which are respectively branched from a high-frequency branch header 62 of the synthetic impedance regulator unit 61 connected with the high-frequency power supply 60 and which are equipped with individual impedance regulator units 64. Moreover, such monitor means for monitoring the energies of the plasmas to be generated between the opposed electrode 10 and the sample electrodes 20 as is exemplified by probes 70 for monitoring the potentials (hereafter referred to as "plasma potentials") owned by the ions floating in the plasmas is removably, in this embodiment, attached to the side wall of the treating chamber 30. The probes 70 are equipped with a plurality of probe elements for measuring the voltage and current characteristics between themselves.

In this embodiment, before the sample treating operations, the energies of the plasmas to be generated between the opposed electrode 10 and the sample electrodes 20, namely, the plasma potentials are equalized in the following manner.

Eight, in this embodiment, dummy samples (although not shown) are conveyed one by one to the treating chamber 30 from the outside by well-known conveyor means (although not shown). The dummy samples thus conveyed are placed one by one on the sample placing faces of the electrode plates 21. After this, the treating chamber 30 is sealed up and is then evacuated to a predetermined vacuum level by actuating the evacuating apparatus. The treating gas is supplied at a predetermined flow rate regulated by the gas flow regulator from the gas source through the gas supply pipe 50 to the gas supply passage of the electrode stem 12. The treating gas thus supplied flows through the gas supply passage into the gas dispersion chamber of the electrode plate 11, in which it is uniformly dispersed. After this, the treating gas is discharged from the gas discharge holes toward the treated faces of the dummy samples which are placed on the sample placing faces of the electrode plates 21. The treating gas thus discharged is partially evacuated by the evacuating apparatus in operation. At this time, the discharge rate of the treating gas from the treating chamber 30 is so regulated by the variable-conductance valve that the inside of the treating chamber 30 is regulated to and maintained at a predetermined treating pressure. In this state, a predetermined high-frequency electric power is applied to the sample electrodes 20, respectively, through the synthetic impedance regulator unit 61 and the individual impedance regulator units 64. By this application of the high-frequency electric power, there are generated between the electrode plate 11 of the opposed electrode 10 and the electrode plates 21 of the respective sample electrodes 20 glow discharges by which the treating gas in the treating chamber 30 is ionized into plasma. The plasma potentials of the plasma generated between the electrode plate 11 of the opposed electrode 10 and the electrode plates 21 of the respective sample electrodes 20, namely, the plasma potentials of the plasmas corresponding to the treated faces of the dummy samples are monitored by the probes 70. In case the monitored values (which are eight in number in this embodiment) of the plasma potentials monitored by the probes 70 are not uniform, the individual impedance regulator units 64 are operated manually or automatically on the basis of those monitored values to adjust the magnitudes of the high-frequency electric power to be applied to the respective sample electrodes 20 such that the monitored values of the plasma potentials monitored by the probes 70 are equalized. Here, it is quite natural that the plasma potentials are equalized to the most desirable potential for treating the samples. At the instant when the equalization of those plasma potentials is ended, the introduction of the treating gas into the treating chamber 30 is interrupted, and the application of high-frequency electric power to the respective sample electrodes 20 is blocked. After this, the dummy samples are conveyed to the outside of the treating chamber 30 by the use of well-known conveyor means.

After this equalization of the plasma potentials, the probes 70 are removed from the treating chamber 30, and eight samples (not shown) are conveyed from the outside into the treating chamber 30 by the well-known conveyor means and are placed on the sample placing faces of the electrode plates 21, respectively. The faces of the samples placed on the electrode plates 21, respectively, are simultaneously subjected to a predetermined treatment by the actions of the plasmas which are generated, as above, to have their potentials equalized. The samples thus treated are conveyed to the outside of the treating chamber 30 by the well-known conveyor means. After this, a new set of eight samples are conveyed from the outside into the treating chamber 30 by the well-known conveyor means and are placed one by one on the sample placing faces of the electrode plates 21. The faces of these samples are also simultaneously subjected to a predetermined treatment by the actions of the plasmas which are generated, as above, to have their potentials equalized. By consecutively repeating these operations, the eight samples have their faces consecutively subjected to the batch treatment by the actions of the plasmas having the equalized potentials.

The following effects can be attained according to the present embodiment.

(1) Since the plasma potentials of the plasmas corresponding to the respective treated faces of the eight samples are equalized so that the faces of the eight samples are treated by the plasmas having said equalized plasma potentials, the uniformity among the respective faces of the eight samples treated simultaneously can be improved.

(2) Since the area of the faces of the sample electrodes can be made as small as that of the treated faces of the samples, the area ratio can be enlarged to suppress any excessive application of the high-frequency electric power to the sample electrodes thereby to prevent any augmentation of the capacitance of the high-frequency power supply.

(3) Since the excessive application of the high-frequency electric power to the sample electrodes can be suppressed, it is possible to prevent any excessive enlargement of supplementary facilities such as the wires for connecting the sample electrodes and the high-frequency power supply or the spaces for the high-frequency insulation.

(4) Since the treating gas spurting from the gas discharge holes of the opposed electrode toward the treated faces of the samples placed on the respective sample electrodes flows radially along the treated faces of the samples, the uniformity of the treatment in the positions of the treated faces of the samples is improved.

Figure 3:
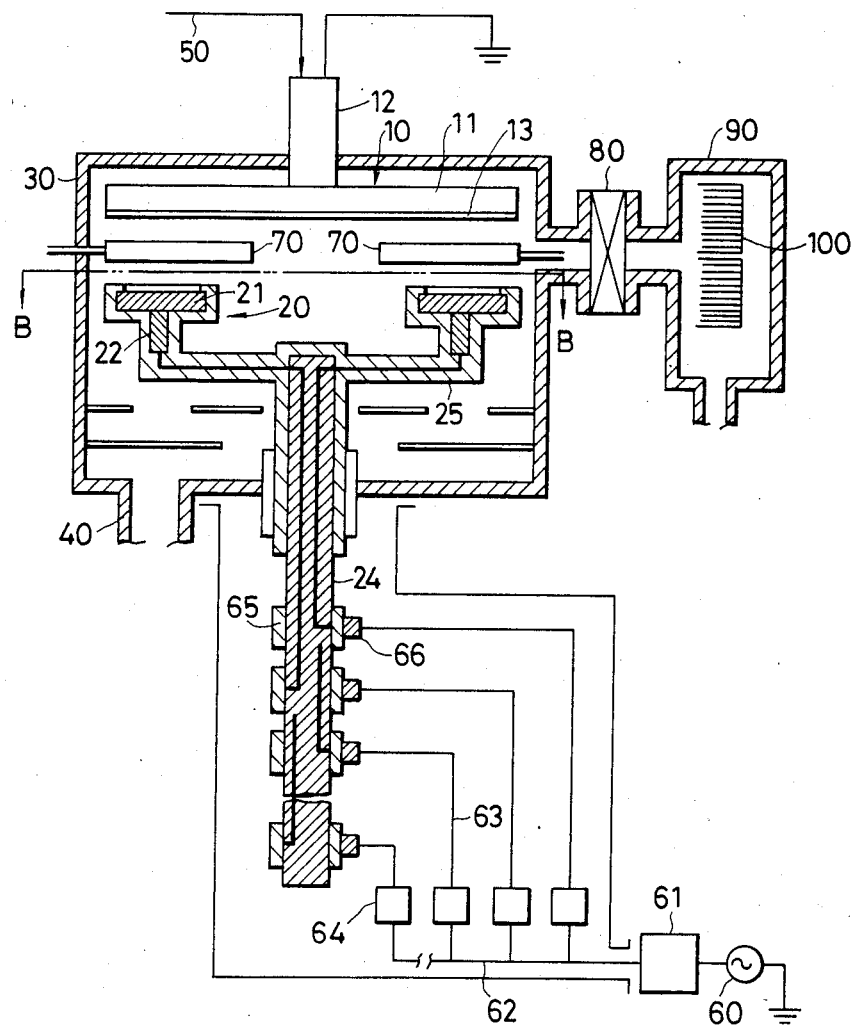
FIG. 3 is a longitudinal section showing a second embodiment of the plasma treating apparatus according to the present invention.

FIGS. 3 and 4 show the second embodiment of the present invention, which is different in the following points from the first embodiment shown in FIGS. 1 and 2. A shaft 24 is so fitted in the bottom wall of the treating chamber 30 in a manner to have its upper end portion protruding into the treating chamber 30 that it can rotate while hermetically sealing the inside of the treating chamber 30. In this embodiment, the shaft 24 is generally aligned with the axis of the electrode stem 12 of the opposed electrode 10. The shaft 24 is made of an electrical insulator. The shaft 24 is equipped at its upper end with supports 25 which are eight in number, in this embodiment, such that they are arranged radially and equi-distantly from one another. The supports 25 are also made of an electrical insulator. In this embodiment, the eight sample electrodes 20 are placed one by one on the respective supports 25. The respective electrode plates 21 of the sample electrodes 20 have their faces directed toward the electrode plate 11 of the opposed electrode 10. The shaft 24 protruding to the outside of the treating chamber 30 is ringed with eight power supply terminals 65 which are arranged vertically and electrically independently of one another. The respective electrode shafts 22 of the sample electrode 20 are connected with the power supply terminals 65, respectively. Brushes 66 are disposed in contact with the power supply terminals 65, respectively. The brushes 66 are connected with the high-frequency branch circuits 63, respectively. Moreover, the shaft 24 is rotationally driven in an intermittent manner through a gear mechanism (not shown), for example, by means of a drive unit (not shown) when the samples are to be conveyed between a cassette 100, which is accommodated in a vacuum preparing chamber 90 communicating with the treating chamber 30 through a gate valve 80, for example, and the respective electrode plates 21 of the sample electrodes 20. The same remaining parts as those appearing in FIGS. 1 and 2 are indicated at the same reference numerals in FIGS. 3 and 4, and their repeated description is omitted.

Effects similar to those of the foregoing first embodiment can be attained according to the present embodiment. At the same time, since the respective sample electrodes can be turned through the supports by rotating the shaft, it is possible to further simplify the conveyor mechanism which conveys the samples into the treating chamber to place them on the respective sample electrodes and receives the treated samples from the respective sample electrodes to convey them to the outside of the treating chamber.

FIG. 5 shows the third embodiment of the present invention, which is different from the foregoing first embodiment of FIG. 1 in that an opposed electrode 10' is formed electrically independently like the sample electrodes 20. In FIG. 5, incidentally, the same remaining parts as those of FIG. 1 are indicated at the same reference numerals, and their description is omitted.

Effects similar to those of the foregoing first embodiment can be attained according to the present embodiment.

FIG. 6 shows the fourth embodiment of the present invention, which is different from the third embodiment of FIG. 5 in that the spaces defined between the electrode plate 11' of the opposed electrode 10' and the electrode plates 21 of the sample electrodes 20 are enclosed by means of cylindrical members 110. These cylindrical members 110 are made of an electrical insulator such as fluoroplastics or quartz or a metallic material such as aluminum. In FIG. 6, the same remaining parts as those of FIG. 5 are indicated at the same reference numerals, and their description is omitted.

Effects similar to those of the foregoing third embodiment can be attained according to the present embodiment. At the same time, since the energy distribution of the plasmas corresponding to the treated faces of the samples can be changed according to the differences in the size, shape and material of the cylindrical members, arbitrary treating characteristics can be selected.

In the foregoing embodiments, incidentally, the high-frequency power supply is used as the power supply but may be replaced by another d.c. or a.c. power supply. In the present embodiment, moreover, the plasma potentials are monitored as the energies of the plasmas. In an alternative, however, excitations or ionizations of the molecules or atoms in the plasmas may be measured by photometry, or the ions in the plasmas may be directly measured by mass spectrometry. Alternatively, the energy of the plasma may be monitored by measuring the electronic states of the atoms or molecules in the plasma by electronic paramagnetic resonance, laser-induced fluorescence or laser double-resonance spectroscopy.

As has been described hereinbefore, the plasma treating method according to the present invention comprises: the step of monitoring the energies of plasmas corresponding to the faces of a plurality of samples to be treated; the step of adjusting to equalize the energies of said plasmas on the basis of the monitored values; and the step of simultaneously treating said samples with the plasmas having said equalized energies. The plasma treating apparatus according to the present invention comprises: a plurality of sample electrodes disposed independently of one another in positions opposed to an opposed electrode in a treating chamber evacuated to be supplied with a treating gas; power supply means for applying and adjusting electric power to said sample electrodes, respectively; and monitor means for monitoring the energy of plasma to be generated between said opposed electrode and said sample electrodes. By adjusting the electric power to be applied independently of one another from a power supply to the independently formed plural sample electrodes such that the energy of the plasmas to be generated between the opposed electrode and the sample electrodes are equalized, therefore, the energy of the plasma corresponding to the respective treated faces of the plural samples is equalized to provide an effect such that the uniformity of treatment among the respective faces of the plural samples to be simultaneously treated can be improved.

What is claimed is:

1. A plasma treating method comprising: a step of independently monitoring the energy of a plasma corresponding to a treated face of an individual sample of a plurality of samples to be simultaneously treated by said plasma; a step of independently adjusting the energy of said plasma corresponding to said treated face of said respective plural samples so as to equalize the energy of said plasma to said plural samples on the basis of the monitored values; and a step of simultaneously treating said plural samples with said plasma having the equalized energy.

2. A plasma treating method according to claim 1, wherein said treating step is conducted in a common treating chamber.

3. A plasma treating method according to claim 2, wherein said monitoring step is conducted by independently monitoring the energy of said plasma in terms of the plasma potentials of said plasmas so as to enable equalization of the plasma potentials on the basis of the monitored values.

4. A plasma treating apparatus comprising: a plurality of sample electrodes disposed independently of one another to lie in a common plane at positions opposed to an opposed electrode in a treating chamber evacuated to be supplied with a treating gas; power supply means for independently applying and adjusting electric power to respective ones of said sample electrodes to equalize the energies of the plasmas to be generated; and monitor means for independently monitoring the energies of plasmas to be generated between said opposed electrodes and respective ones of said sample electrodes.

5. A plasma treating apparatus according to claim 4, wherein said sample electrodes are fixed in an electrically insulated manner in said treating chamber, wherein said power supply means includes: a high-frequency power supply; a synthetic impedance regulator unit connected with said high-frequency power supply; and individual impedance regulator units which are disposed in high-frequency branch circuits branched respectively from a high-frequency branch header of said synthetic impedance regulator unit, and wherein said high-frequency branch circuits are connected with said sample electrodes.

6. A plasma treating apparatus according to claim 5, wherein said monitor means includes probes for monitoring the plasma potentials of said plasmas.

7. A plasma treating apparatus according to claim 6, wherein said opposed electrode is formed correspondingly but independently of said sample electrodes.

8. A plasma treating apparatus according to claim 7, further comprising cylindrical members enclosing the spaces between said opposed electrode and said sample electrodes.

9. A plasma treating apparatus according to claim 4, wherein said sample electrodes are electrically insulated from said treating chamber and made rotatable while maintaining said treating chamber hermetically sealed wherein said power supply means includes: a high-frequency power supply; a synthetic impedance regulator unit connected with said high-frequency power supply; individual impedance regulator units which are disposed in high-frequency branch circuits branched respectively from a high-frequency branch header of said synthetic impedance regulator unit; brushes connected with said high-frequency branch circuits; and power supply terminals contacting with said brushes, and wherein said sample electrodes and said power supply terminals are connected with each other.

10. A plasma treating apparatus according to claim 9, wherein said monitor means includes probes for monitoring the plasma potentials of said plasmas.

11. A plasma treating apparatus according to claim 10, wherein said opposed electrode is formed correspondingly but independently of said sample electrodes.

12. A plasma treating apparatus according to claim 11, further comprising cylindrical members enclosing the spaces between said opposed electrode and said sample electrodes.

13. A plasma treating apparatus comprising:
a plurality of sample electrodes disposed in a common plane in opposition to an opposed electrode in a treating chamber evacuated to be supplied with a treating gas;
power supply means for independently applying and adjusting electric power to respective ones of said sample electrodes; and
monitor means for independently monitoring the energies of plasmas to be generated between said opposed electrode and respective ones of said sample electrodes, said opposed electrode being formed correspondingly to but independently of respective ones of said sample electrodes.

14. A plasma treating apparatus comprising:

a plurality of sample electrodes disposed in a common plane in positions opposing an opposed electrode for being intermittently rotated in a treating chamber evacuated to be supplied with a treating gas;

power supply means for independently applying and adjusting electric power to respective ones of said sample electrodes;

monitor means for independently monitoring the energies of plasmas to be generated between said opposed electrode and respective ones of said sample electrodes;

drive means for intermittently rotating said plurality of sample electrodes;

a vacuum preparing chamber communicating with said treating chamber through a vacuum-space cutoff means, said vacuum preparing chamber accommodating a cassette therein; and conveying means for conveying samples between said cassette and the common plane of respective ones of said sample electrodes through said vacuum-space cutoff means.

* * * * *